US012635541B2

(12) United States Patent
Ecton et al.

(10) Patent No.: US 12,635,541 B2
(45) Date of Patent: May 19, 2026

(54) CONFORMABLE DIE BOND FILM (DBF) IN GLASS CAVITY

(71) Applicant: Intel Corporation, Santa Clara, CA (US)

(72) Inventors: Jeremy D. Ecton, Gilbert, AZ (US); Brandon C. Marin, Gilbert, AZ (US); Srinivas V. Pietambaram, Chandler, AZ (US); Gang Duan, Chandler, AZ (US); Suddhasattwa Nad, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 116 days.

(21) Appl. No.: 17/889,238

(22) Filed: Aug. 16, 2022

(65) Prior Publication Data

US 2024/0063127 A1 Feb. 22, 2024

(51) Int. Cl.
| | |
|---|---|
| *H10W 70/65* | (2026.01) |
| *H10W 70/60* | (2026.01) |
| *H10W 70/68* | (2026.01) |
| *H10W 70/685* | (2026.01) |
| *H10W 70/692* | (2026.01) |
| *H10W 90/00* | (2026.01) |
| *H10W 74/15* | (2026.01) |

(52) U.S. Cl.
CPC .......... *H10W 70/65* (2026.01); *H10W 70/611* (2026.01); *H10W 70/614* (2026.01); *H10W 70/68* (2026.01); *H10W 70/685* (2026.01); *H10W 70/692* (2026.01); *H10W 90/00* (2026.01); *H10W 90/401* (2026.01); *H10W 90/701* (2026.01); *H10W 70/60* (2026.01);

*H10W 70/682* (2026.01); *H10W 74/15* (2026.01); *H10W 90/724* (2026.01); *H10W 90/734* (2026.01)

(58) Field of Classification Search
CPC ..... H01L 23/5381; H01L 23/13; H01L 23/15; H10W 70/65
See application file for complete search history.

(56) References Cited

U.S. PATENT DOCUMENTS

| | | | | |
|---|---|---|---|---|
| 10,373,893 | B2 * | 8/2019 | Vaidya | H01L 25/0655 |
| 10,535,608 | B1 * | 1/2020 | Rubin | H01L 23/055 |
| 10,833,052 | B2 * | 11/2020 | Shih | H01L 23/5383 |
| 11,302,643 | B2 * | 4/2022 | Ganesan | H01L 23/5384 |
| 11,342,305 | B2 * | 5/2022 | Elsherbini | H01L 25/0652 |
| 2019/0304912 | A1 * | 10/2019 | Ecton | H01L 23/5381 |
| 2020/0273840 | A1 * | 8/2020 | Elsherbini | H01L 24/08 |
| 2020/0350251 | A1 * | 11/2020 | Pietambaram | H01L 21/4857 |
| 2022/0223534 | A1 * | 7/2022 | Lin | H01L 23/3171 |
| 2023/0038892 | A1 * | 2/2023 | Chen | H01L 25/0655 |

OTHER PUBLICATIONS

Takemura et al., "Silicon-Photonics-Embedded Interposers as Co-Packaged Optics Platform", Transactions of The Japan Institute of Electronics Packaging, vol. 15, 2022, 13 pgs.

* cited by examiner

*Primary Examiner* — Errol V Fernandes
(74) *Attorney, Agent, or Firm* — Schwabe, Williamson & Wyatt, P.C.

(57) ABSTRACT

Embodiments disclosed herein include electronic packages. In an embodiment, the electronic package comprises a first substrate with a cavity, where the first substrate comprises glass. In an embodiment, a second substrate is in the cavity. In an embodiment, a bond film covers a bottom of the second substrate and extends up sidewalls of the second substrate.

27 Claims, 13 Drawing Sheets

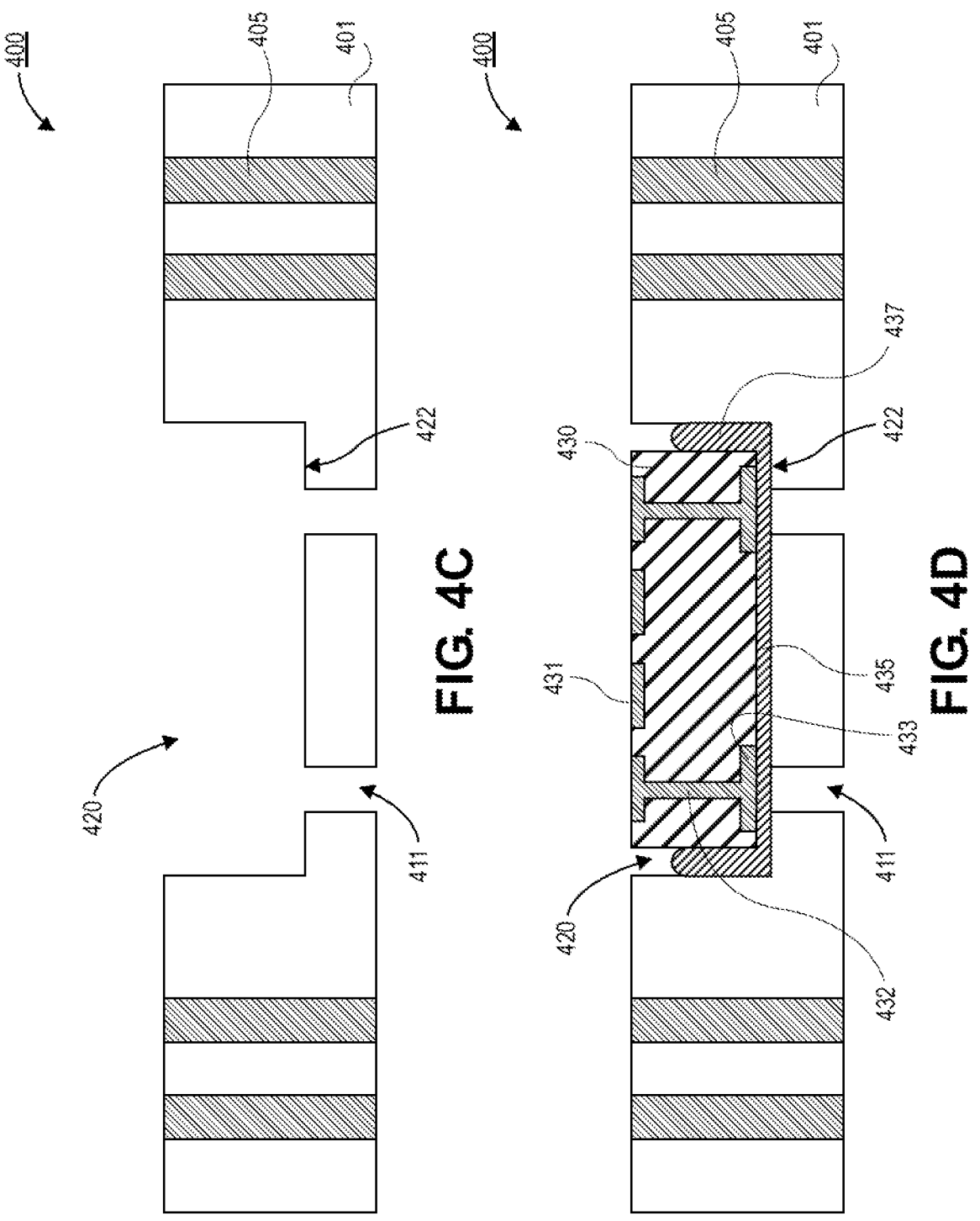

CONFORMABLE DIE BOND FILM (DBF) IN GLASS CAVITY

TECHNICAL FIELD

Embodiments of the present disclosure relate to electronic packages, and more particularly to electronic packages that include a glass substrate with an embedded bridge that is over a conformable die bond film (DBF).

BACKGROUND

The demand for miniaturization of form factor and increased levels of integration for high performance are driving sophisticated packaging approaches in the semiconductor industry. Die partitioning enables miniaturization of small form factor and high performance without yield issues seen with other methods but needs fine die to die interconnections. Embedded bridge solutions are a breakthrough technology that enables a lower cost and simpler 2.5D packaging approach for very high-density interconnects between heterogeneous dies on a single package. Instead of an expensive silicon interposer with through silicon vias (TSVs), a small silicon bridge chip is embedded in the package, enabling very high density die-to-die connections only where needed. Standard flip-chip assembly is used for robust power delivery and to connect high-speed signals directly from chip to the package substrate.

For future generations of die partitioning, several bridges that can connect the dies at much finer bump pitches (25 microns or lower) are needed. Particularly, the embedded bridge approach suffers from a high cumulative bump thickness variation (BTV) and as the number of bridges to be embedded increase, cost of embedding and yields will suffer. Alternate architectures and/or approaches have been proposed and are being actively investigated. Such approaches may include silicon interposers and/or glass interposers. The interposers may further include TSVs or the like. Fine die-to-die interconnections for die tiling can be accomplished through this architecture.

An alternative approach being explored is inserting a silicon bridge into a nested glass interposer. Such an approach requires placing a bridge inside of a glass cavity. One challenge with this approach is the significant cavity depth variation (+/−10%). Additionally, the cavity may not be flat resulting in tilt of the final position of the silicon bridge in the cavity.

BRIEF DESCRIPTION OF THE DRAWINGS

FIG. 4C is a cross-sectional illustration of the glass substrate after a cavity and backside via openings are formed, in accordance with an embodiment.

FIG. 4D is a cross-sectional illustration of the glass substrate after a bridge is inserted into the cavity and a bond film conforms to the bridge, in accordance with an embodiment.

EMBODIMENTS OF THE PRESENT DISCLOSURE

Described herein are electronic packages that include a glass substrate with an embedded bridge that is over a conformable die bond film (DBF), in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, cavities in glass substrates are prone to having non-uniform depths. In some instances, a depth variation of the cavity may be +/−ten percent of the average depth of the cavity. Additionally, the bottom surface of the cavity may be sloped. That is, the bottom surface of the cavity may not be parallel to a top surface of the glass substrate. This cavity non-uniformity makes the integration of bridge substrates difficult.

Figure 1:
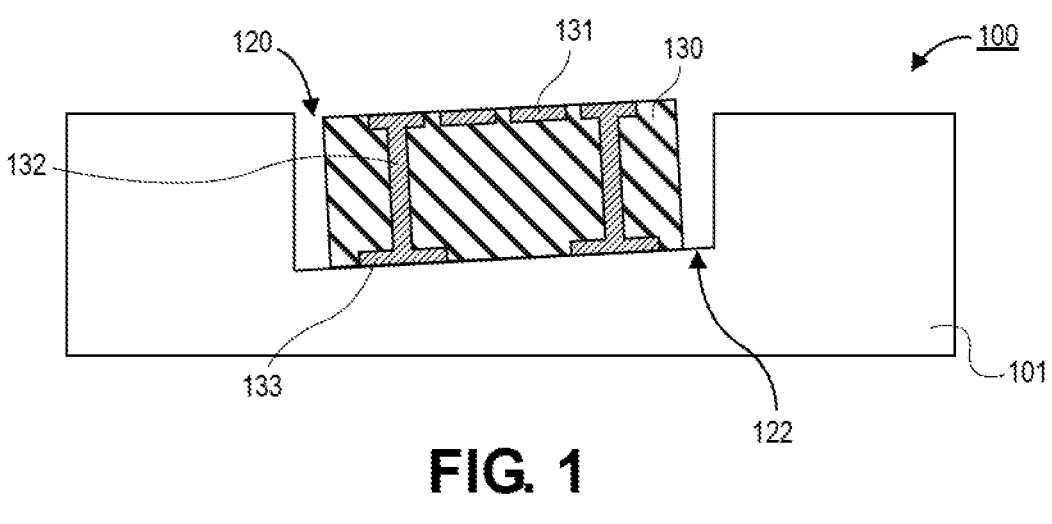
FIG. 1 is a cross-sectional illustration of an electronic package with a glass substrate and a cavity with a sloped bottom surface, in accordance with an embodiment.

For example, in FIG. 1, a cross-sectional illustration of an electronic package 100 with a glass substrate 101 is shown, in accordance with an embodiment. As shown, the cavity 120 has a bottom surface 122 that is sloped. That is, the depth of the cavity 120 is non-uniform. Accordingly, when placing a bridge 130 in the cavity 120, the top surface of the bridge 130 is sloped. The bridge 130 may include top pads 131, through substrate vias (TSVs) 132, and bottom pads 133. Due to the non-uniform depth of the cavity 120, the top pads 131 are not at the same Z-height. This generates problems when connecting additional components (e.g., dies) to the bridge 130. This problem is magnified when multiple bridges 130 are used in the same glass substrate 101.

Accordingly, embodiments disclosed herein include a bond film that compensates for any depth variation in the cavity. The bond film may be a conformal material. When the bridge is pressed into the bond film, the bond film conforms to the surfaces of the bridge and allows for the top of the bridge to remain parallel to the top surface of the substrate. In some embodiments, the top surface of the bridge may be substantially coplanar with a top surface of the glass substrate. As used herein, substantially coplanar may refer to two planes that are parallel to each other and within approximately 2 μm of each other in a direction perpendicular to the two planes. For example, the offset may be in the Z-direction in some embodiments. Additionally, substantially coplanar planes may also include a pair of planes that are not perfectly parallel to each other. For example, substantially coplanar planes may have a first plane that is tilted up to approximately 3° compared to the second plane. As used herein, "approximately" may refer to a range of values that are +/−ten percent from the stated value. For example, approximately 2 μm may refer to a range between 1.8 μm and 2.2 μm.

In an embodiment, when the bond film conforms to the bridge, the bond film may extend up sidewalls of the bridge. For example, the bond film may extend up sidewalls of the bridge by a distance up to approximately 100 μm. Though, it is to be appreciated that even greater distances may be exhibited in some embodiments. In a particular embodiment, the bond film may extend up sidewalls of the bridge by a distance between approximately 10% and approximately 90% of a depth of the cavity. In an embodiment, after the bridge is pressed into the bond film, the bond film is cured in order to prevent further motion of the bridge.

By providing a bridge with a top surface that is substantially coplanar with a top surface of the glass substrate, it is easier to integrate dies that are to be coupled to the bridge.

In some embodiments, one or more buildup layers are provided over the bridge, and the dies are coupled to the bridge through the buildup layers. In other embodiments, the dies may be directly coupled to the bridge through bonding, such as hybrid bonding architectures. In yet another embodiment, the bridge may be coupled to the dies through solder interconnects or the like.

Figure 2A:
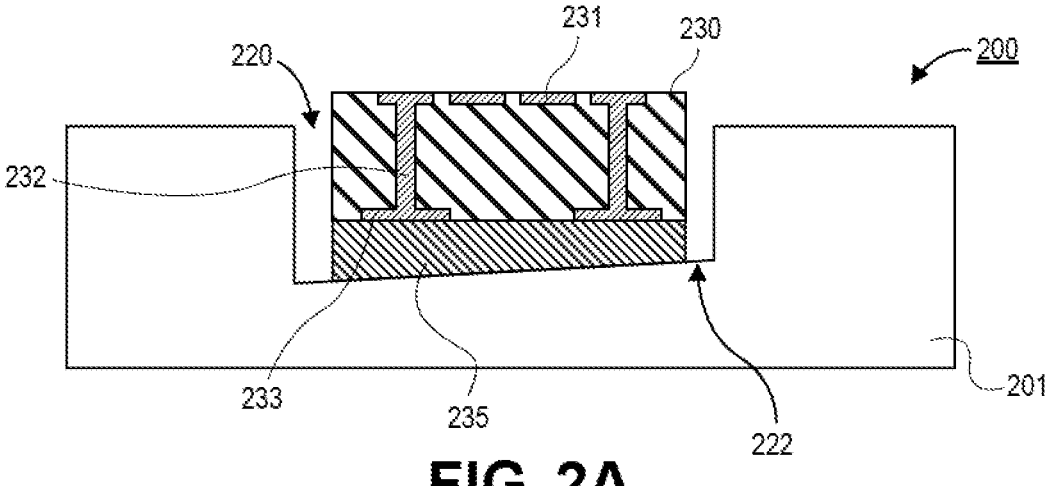
FIG. 2A is a cross-sectional illustration of a glass substrate with a cavity that has a sloped bottom surface and a bond film between a bridge and the bottom surface of the cavity, in accordance with an embodiment.

Referring now to FIG. 2, a cross-sectional illustration of an electronic package 200 is shown, in accordance with an embodiment. In an embodiment, the electronic package 200 may comprise a first substrate, such as a glass substrate 201. The glass substrate 201 may be any suitable thickness. In a particular embodiment, the glass substrate 201 may have a thickness between approximately 50 μm and approximately 1,000 μm. Though, smaller or larger thicknesses may also be used in some embodiments. In a particular embodiment, the glass substrate 201 may be a glass material that can be etched with a laser process. For example, laser exposure may modify a crystal structure and/or phase of the glass and render the exposed areas as being more susceptible to an etching chemistry.

In an embodiment, the glass substrate 201 may include a cavity 220. The cavity 220 may be a depth suitable for accommodating a second substrate, such as a bridge 230. For example, the depth of the cavity 220 may be greater than a height of the bridge 230. For example, the depth of the cavity 220 may be between approximately 50 μm and approximately 500 μm. In an embodiment, a depth of the cavity 220 may be non-uniform. That is, the cavity 220 may have a depth variation that is plus or minus ten percent of the average depth of the cavity 220. In a particular embodiment, the cavity 220 may have a bottom surface 222 that is sloped. The sloped bottom surface 222 may have a first edge (e.g., the left edge in FIG. 2A) that is deeper into the glass substrate 201 than a second edge (e.g., the right edge in FIG. 2A).

In an embodiment, a bond film 235 may be provided between a bottom surface of the bridge 230 and the bottom surface 222 of the cavity 220. The bond film 235 may be a conformal material. As such, the bond film 235 may allow for the bridge 230 to have a top surface that is parallel to a top surface of the glass substrate 201. The bond film 235 may comprise a low filler buildup film (e.g., with a filler percentage that is less than 30%), a liquid buildup film, or polydimethylsiloxane (PDMS) or the like. The bond film 235 may also be a hybrid or multilayered film consisting of conventional bond film material and the previously mentioned materials. Furthermore, a solder (e.g., tin or tin alloys (such as a high melting point Sn/Au, etc.)) can also be used wherein solder is plated on backside of DIE and pressed under heat (above melting point of solder), followed by a cooling step to fix the DIE in place. In an embodiment, the bond film 235 may be dispensed on the backside of the bridge 230. That is, the bond film 235 may only be in contact with a backside of the bridge 230 in some embodiments.

In an embodiment, the bridge 230 may include any bridge architecture for connecting a pair of dies together with high density routing. For example, the bridge 230 may include top pads 231. One or more of the top pads 231 may be coupled to backside pads 233 by vias 232 (e.g., TSVs). The bridge 230 may comprise any suitable substrate material. For example, the bridge 230 may comprise a semiconductor material, such as silicon. While vias 232 are shown, it is to be appreciated that the bridge 230 may omit vias and backside pads 233 in some embodiments.

Figure 2B:
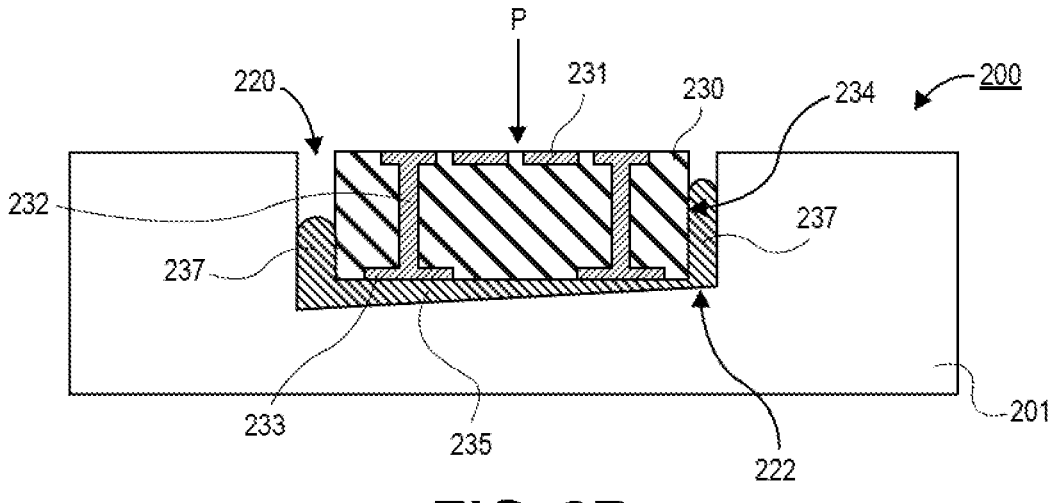
FIG. 2B is a cross-sectional illustration of the glass substrate after the bridge is pressed into the bond film and the bond film conforms around the bridge, in accordance with an embodiment.

Referring now to FIG. 2B, a cross-sectional illustration of the package substrate 200 after the bridge 230 is pressed into the bond film 235 is shown, in accordance with an embodiment. As shown by the arrow, a pressure P may be applied to the top surface of the bridge 230 in order to insert the bridge 230 fully into the cavity 220. In an embodiment, a plate with a width greater than a width of the cavity 220 may be applied to the top surface of the bridge 230 and pressed down by the pressure P. The plate stops on the top surface of the glass substrate 201. As such, the top surface of the bridge 230 will be substantially coplanar with a top surface of the glass substrate 201. That is, the top pads 231 may be substantially coplanar with the top surface of the glass substrate 201.

In an embodiment, the insertion of the bridge 230 results in the deformation of the bond film 235. As shown, the bond film 235 may extend up sidewalls 234 of the bridge 230. For example, the bond film 235 may extend up to approximately 20 μm or more up the sidewalls 234 of the bridge 230. As shown in FIG. 2B, a portion 237 of the bond film 235 may separate the sidewalls 234 of the bridge 230 from the sidewalls of the cavity 220. In some instances, the bond film 235 does not extend entirely up the sidewalls 234 of the bridge 230. That is, a certain volume of the cavity 220 may not be filled by the bridge 230 and the bond film 235. In some embodiments, the height of the sidewall portions 237 may be non-uniform. For example, the sidewall portion 237 on the right side of the bridge is higher than the sidewall portion 237 on the left side of the bridge. In some embodiments, the differences in the height of sidewall portions 237 may be approximately 1 μm or greater. The non-uniform heights of the sidewall portions 237 may be caused by the depth variation in the cavity 220.

Figure 3:
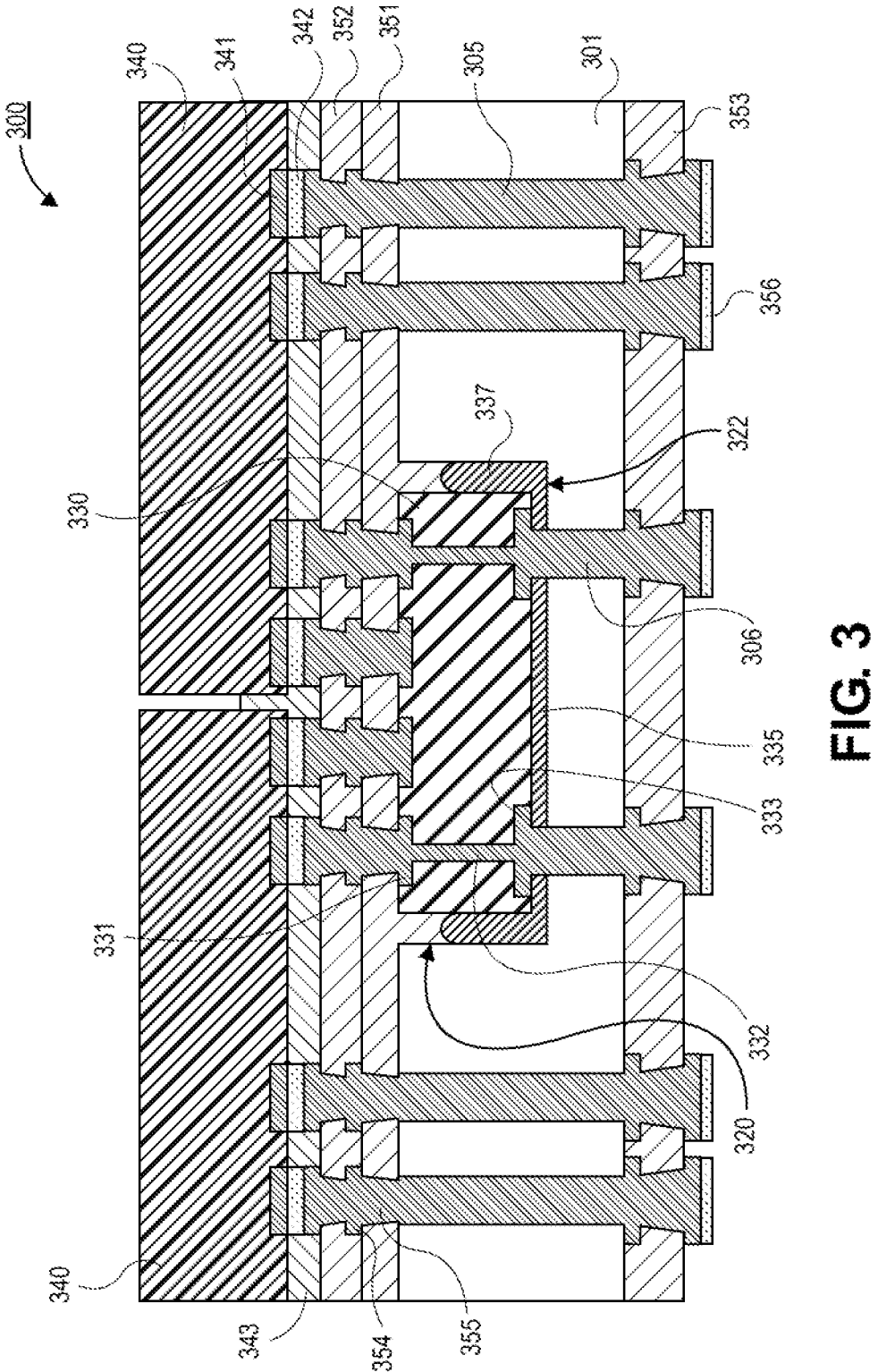
FIG. 3 is a cross-sectional illustration of an electronic package that includes a bridge embedded in a glass cavity, where a bond film conforms around the bridge, in accordance with an embodiment.

Referring now to FIG. 3, a cross-sectional illustration of an electronic package 300 is shown, in accordance with an embodiment. In an embodiment, the electronic package 300 comprises a first substrate, such as a glass substrate 301. The glass substrate 301 may be substantially similar to the glass substrate 201 described in greater detail above. In a particular embodiment, the glass substrate 301 may comprise a cavity 320. The cavity 320 may have a bottom surface 322. In the illustrated embodiment, the bottom surface 322 is substantially flat for ease of illustration. However, it is to be appreciated that the bottom surface 322 may be sloped relative to a top surface of the glass substrate 301. Alternatively, or in addition to the sloped configuration, the cavity 320 may have a non-uniform depth variation. For example, the depth variation of the cavity 320 may be plus or minus ten percent of the average depth of the cavity 320.

In an embodiment, a bridge 330 may be provided in the cavity 320. The bridge 330 may comprise top pads 331, vias 332, and bottom pads 333. The bridge 330 may be silicon substrate or the like. The bridge 330 provides high density routing between the overlying dies 340. In an embodiment, a top surface of the bridge 330 is substantially coplanar with a top surface of the glass substrate 301. In order to provide the coplanar configuration, a bond film 335 may be provided between the bridge 330 and the bottom surface 322 of the cavity 320. The bond film 335 may also include portions 337 that extend up the sidewalls of the bridge 330. That is, portions of the bridge 330 may be separated from sidewalls of the cavity 320 by the sidewall portions 337 of the bond film 335. The sidewall portions 337 may extend up vertically a distance up to 100 μm. Though, greater heights may also be provided for the sidewall portions 337 in some embodiments. In a particular embodiment, the bond film may extend up sidewalls of the bridge by a distance between approximately 10% and approximately 90% of a depth of the cavity 320.

In an embodiment, the bottom pads 333 may be coupled to backside vias 306 that are provided below the cavity 320. As such, signaling and/or power can be provided through the backside of the bridge 330. The glass substrate 301 may also include vias 305 adjacent to the cavity 320. In the illustrated embodiment, the vias 305 and 306 are shown with substantially vertical sidewalls. However, in some embodiments, the sidewalls of the vias 305 may be tapered.

In an embodiment, buildup layers 351, 352, and 353 may be provided above and/or below the glass substrate 301. For example, buildup layer 351 and 352 are provided over the glass substrate 301, and buildup layer 353 is provided below the glass substrate 301. The buildup layer 351 may also fill the remaining portion of the cavity 320 not filled by the bridge 330 and the bond film 335. In an embodiment, conductive routing (e.g., pads 354, vias 355, etc.) may be provided in and/or on the buildup layers 351, 352, and 353. In an embodiment, solder 356 may be provided on the bottommost pads 354, and solder 342 may be provided on the top most pads 354. The solder 356 may couple the package substrate 300 to a board, or the like (not shown). The solder 342 may couple the top most pads 354 to dies 340. The dies 340 may be any type of die, such as CPU, GPU, FGPA, SoCs, memory, or the like. In an embodiment, an underfill 343 may surround the solder 342.

Referring now to FIGS. 4A-4J, a series of cross-sectional illustrations depicting a process for forming an electronic package 400 is shown, in accordance with an embodiment. In an embodiment, the electronic package 400 may be substantially similar to the electronic package 300 shown in FIG. 3. However, it is to be appreciated that similar processing operations may be used to form electronic packages similar to any of the embodiments described in greater detail herein.

Figures 4A, 4B:
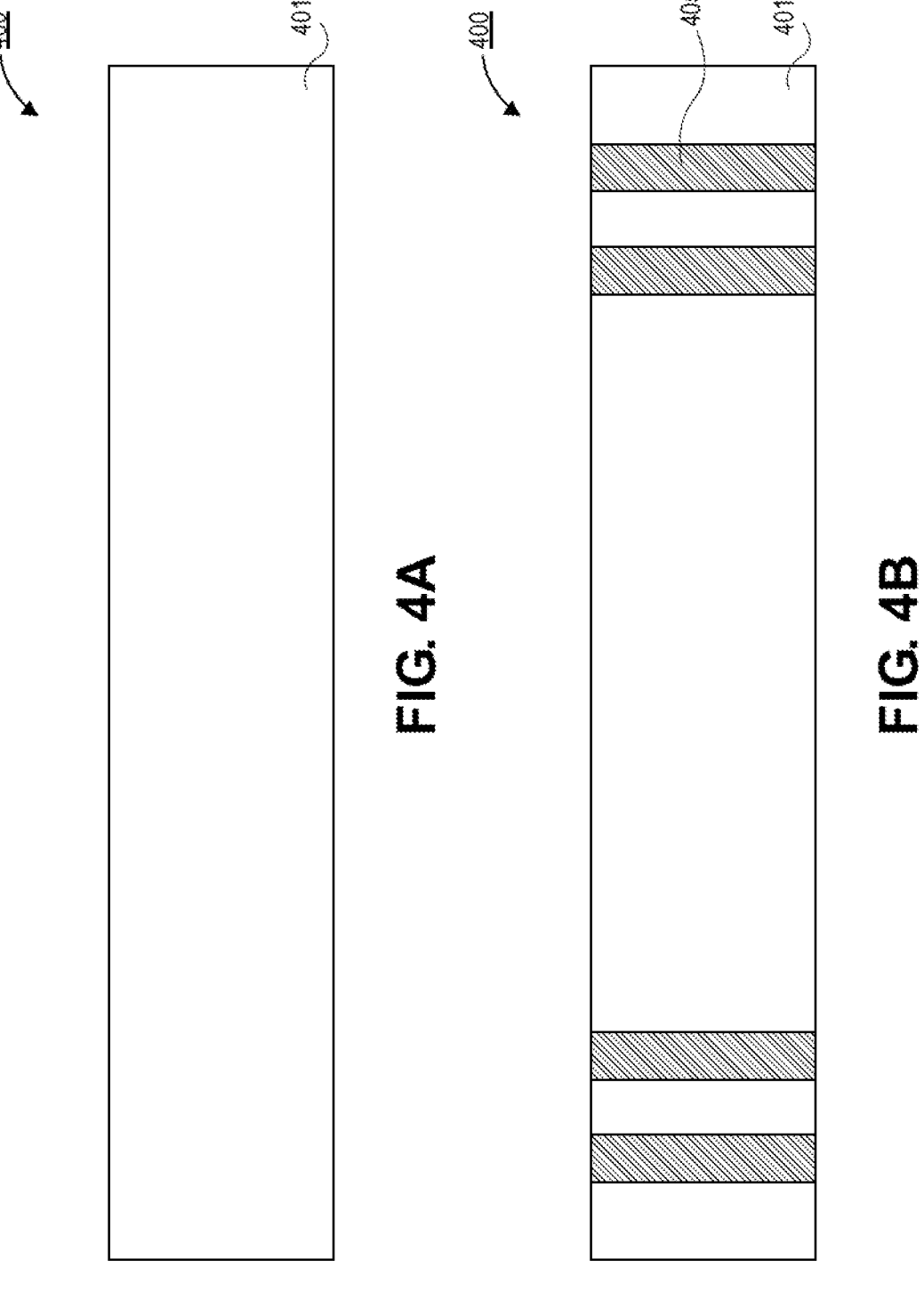
FIG. 4A is a cross-sectional illustration of a glass substrate, in accordance with an embodiment.
FIG. 4B is a cross-sectional illustration of the glass substrate after through glass vias (TGVs) are formed through the glass substrate, in accordance with an embodiment.

Referring now to FIG. 4A, a cross-sectional illustration of an electronic package 400 with a glass substrate 401 is shown, in accordance with an embodiment. In an embodiment, the glass substrate 401 may have a thickness between approximately 50 μm and approximately 1,000 μm. Though larger thicknesses may also be used in some instances. In an embodiment, the glass substrate 401 may include a glass material that is suitable for a laser exposure and etching process. That is, exposure to a laser may result in the microstructure and/or phase of the glass material changing. The exposed regions of the glass substrate 401 are thus more susceptible to an etching chemistry.

Referring now to FIG. 4B, a cross-sectional illustration of the electronic package 400 after through substrate vias 405 are formed is shown, in accordance with an embodiment. In an embodiment, the vias 405 may pass through an entire thickness of the glass substrate 401. The vias 405 may be formed with a laser exposure and etching process followed by a metal deposition process. For example, the vias 405 may comprise copper or the like. In the illustrated embodiment, the vias 405 have substantially vertical sidewalls. In other embodiments, sidewalls of the vias 405 may be tapered. In some instances, the vias 405 may have hourglass shaped cross-sections. That is, the tops and bottoms of the vias 405 are wider than middles (in the Z-direction) of the vias 405.

Referring now to FIG. 4C, a cross-sectional illustration of the electronic package 400 after a cavity 420 is formed in the glass substrate 401 is shown, in accordance with an embodiment. The process for forming the cavity 420 may not be a precise process. As such, the bottom surface 422 may be sloped and/or the cavity 420 may have a depth variation that is plus or minus ten percent of an average depth of the cavity 420. In an embodiment, the cavity 420 may be formed with a laser exposure and etching process. In some embodiments, backside via openings 411 may also be provided into the backside surface of the glass substrate 401. The backside via openings 411 may intersect with the bottom surface 422 of the cavity.

Referring now to FIG. 4D, a cross-sectional illustration of the electronic package 400 after a bridge 430 is inserted into the cavity 420 is shown, in accordance with an embodiment. In an embodiment, the bridge 430 may comprise top pads 431, vias 432 and bottom pads 433. The bottom pads 433 may be aligned over the backside via openings 411. In an embodiment, a bond film 435 may be provided between a bottom of the bridge 430 and the bottom surface 422 of the cavity 420. The bond film 435 may also comprise portions 437 that extend up sidewalls of the bridge 430. The bond film 435 may allow for any non-uniformity in the bottom surface 422 to be adjusted for in order to enable the top surface of the bridge 430 to be substantially coplanar with a top surface of the glass substrate 401.

Figures 4E, 4F:
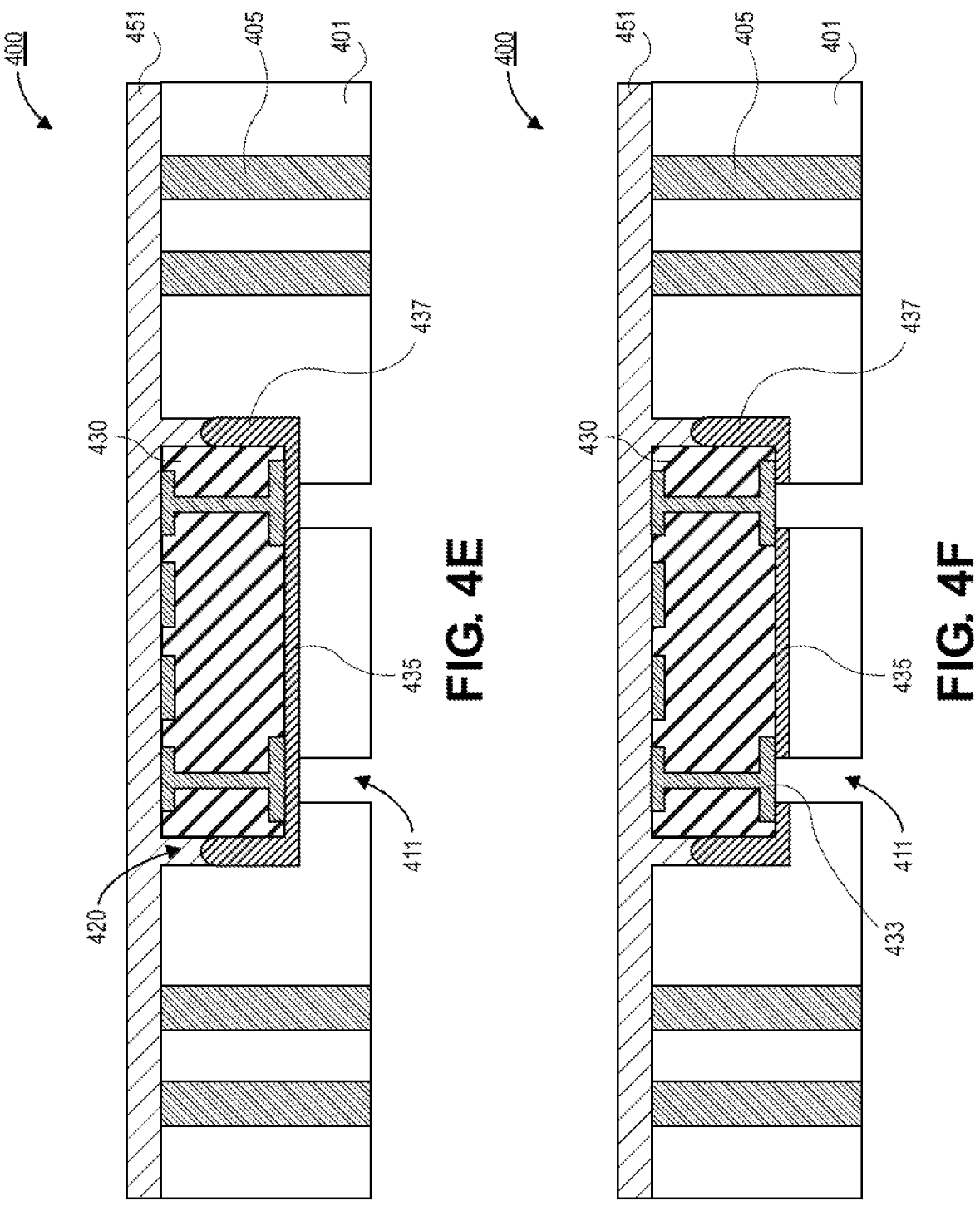
FIG. 4E is a cross-sectional illustration of the glass substrate after a buildup layer is disposed over the glass substrate, in accordance with an embodiment.
FIG. 4F is a cross-sectional illustration of the glass substrate after openings are formed through the bond film, in accordance with an embodiment.

Referring now to FIG. 4E, a cross-sectional illustration of the electronic package 400 after a buildup layer 451 is applied over the glass substrate 401 is shown, in accordance with an embodiment. In an embodiment, the buildup layer 451 may be laminated over the glass substrate 401 and the bridge 430. In some embodiments, the buildup layer 451 may also fill any remaining space in the cavity 420. That is, the buildup layer 451 may directly contact the sidewall portions 437 of the bond film 435.

Referring now to FIG. 4F, a cross-sectional illustration of the electronic package 400 after a backside via opening process is implemented is shown, in accordance with an embodiment. In an embodiment, a plasma etching process or the like may be used to clear the bond film 435 from over the bottom pads 433. That is, the backside pads 433 may be exposed by the backside via openings 411. Accordingly, electrical contact to the backside of the bridge 430 is enabled.

Figure 4G:
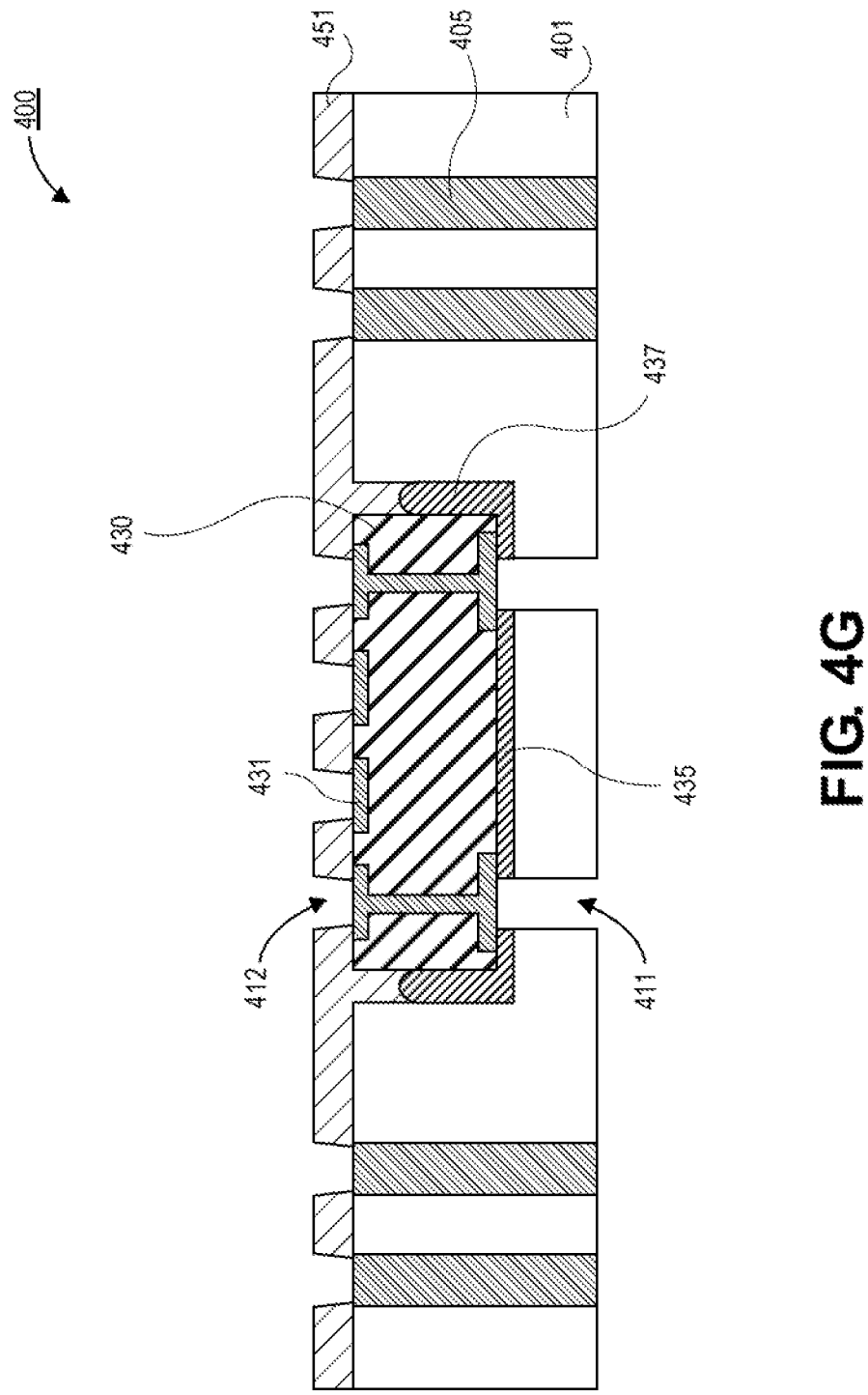
FIG. 4G is a cross-sectional illustration of the glass substrate after openings are formed in the buildup layer, in accordance with an embodiment.

Referring now to FIG. 4G, a cross-sectional illustration of the electronic package 400 after openings 412 are formed in the buildup layer 451 is shown, in accordance with an embodiment. In an embodiment, the openings 412 may be formed with a laser exposure process. As such, sidewalls of the openings 412 may be tapered. The openings 412 expose tops of the top pads 431 on the bridge 430 and the vias 405.

Figure 4H:
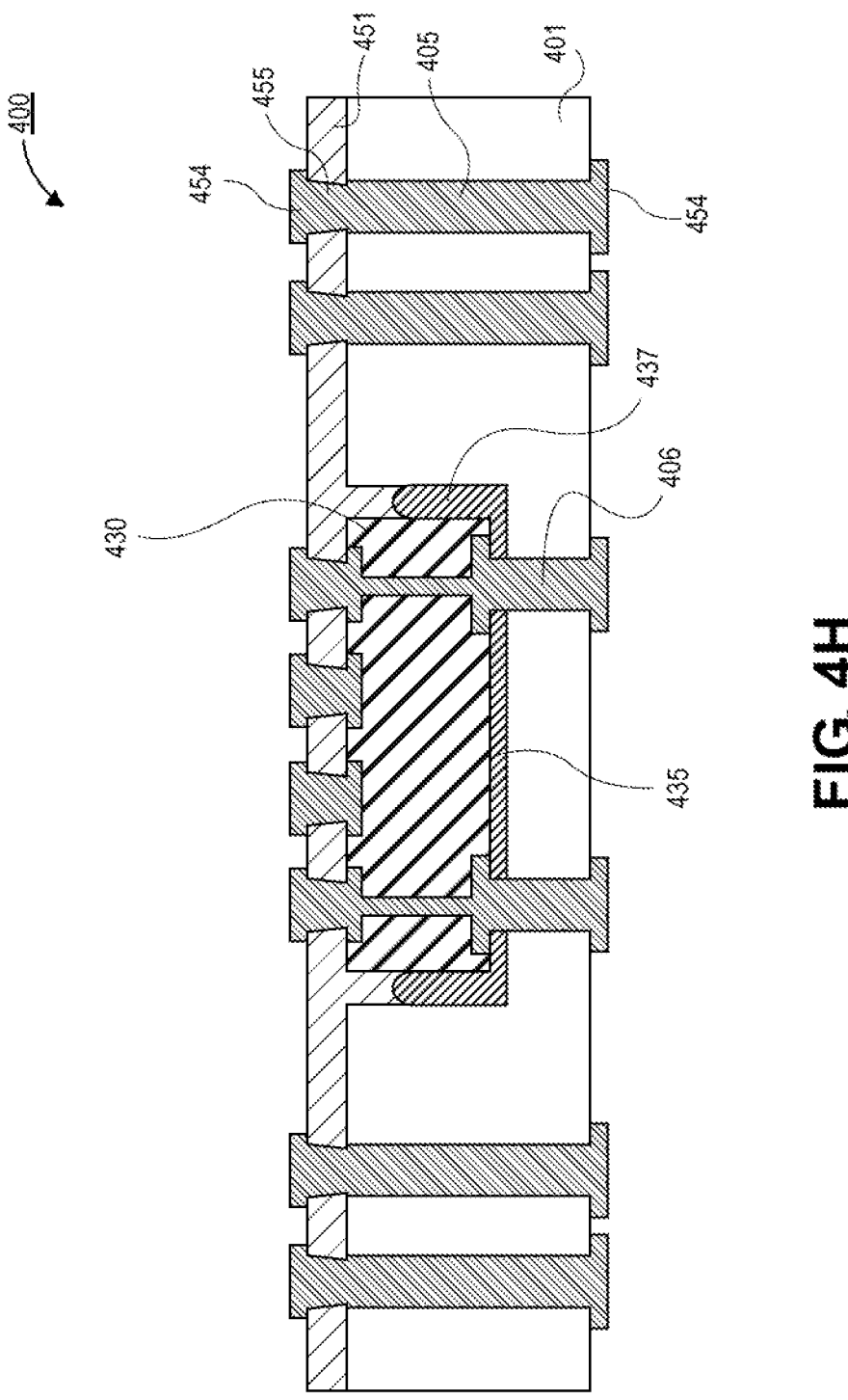
FIG. 4H is a cross-sectional illustration of the glass substrate after routing is provided in the buildup layer and backside vias coupled to the bridge are formed, in accordance with an embodiment.

Referring now to FIG. 4H, a cross-sectional illustration of the electronic package 400 after conductive routing is provided above and below the glass substrate 401 is shown, in accordance with an embodiment. As shown, pads 454 may be provided on the backside of the glass substrate 401. Additionally, vias 455 and pads 454 may be provided on and in the buildup layer 451.

Figure 4I:
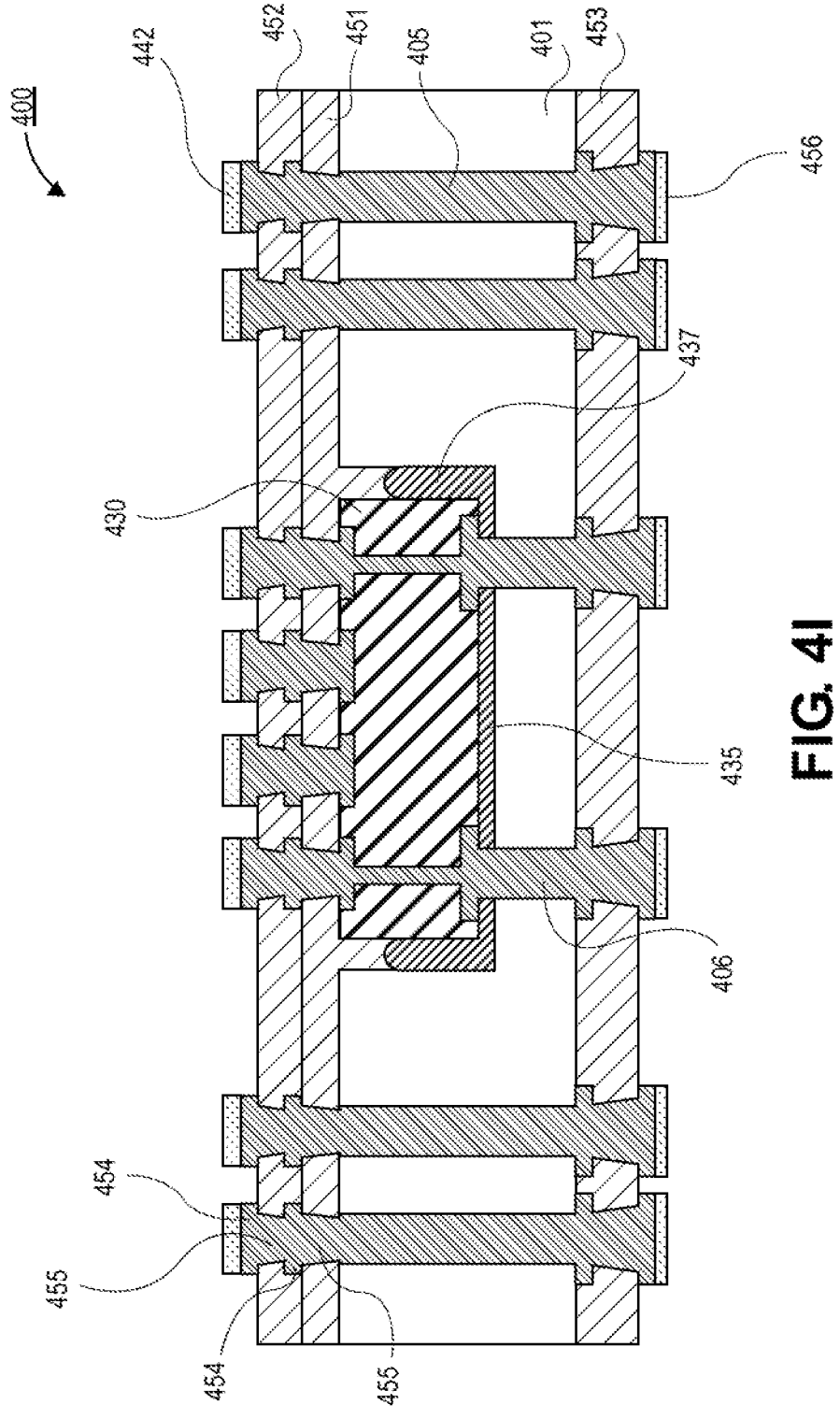
FIG. 4I is a cross-sectional illustration of the glass substrate after additional routing and solder is provided, in accordance with an embodiment.

Referring now to FIG. 4I, a cross-sectional illustration of the electronic package 400 after additional buildup layers 452 and 453 are formed is shown, in accordance with an embodiment. In an embodiment, buildup layer 453 may be provided below the glass substrate 401. The buildup layer 453 may include vias 455 and pads 454. A solder 456 may be applied over bottommost pads 454. Similarly, buildup layer 452 and conductive features (e.g., vias 455 and pads 454) may be provided over a top surface of the glass substrate 401. In an embodiment, solder 442 may be provided over the top most pads 454.

Figure 4J:
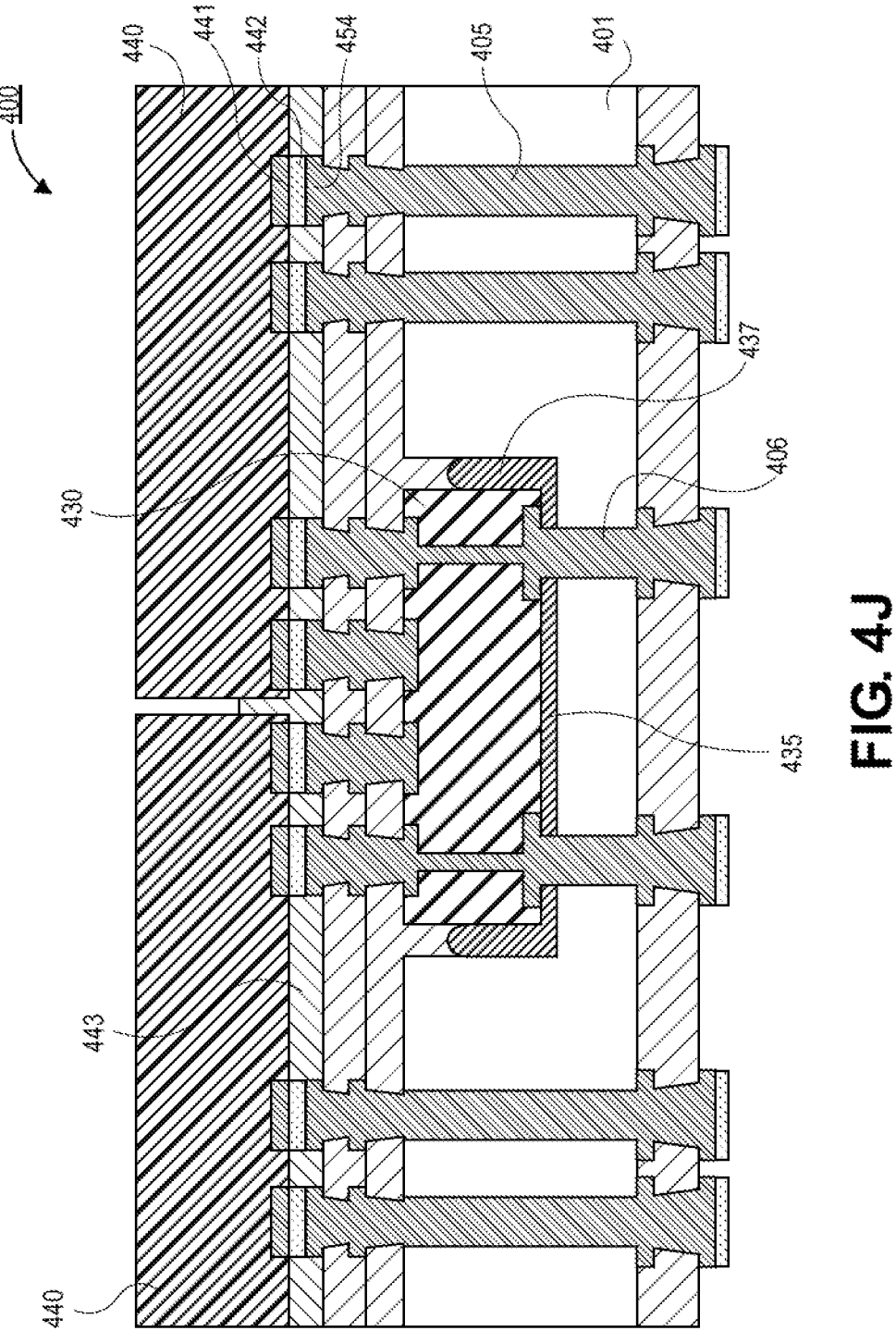
FIG. 4J is a cross-sectional illustration of the glass substrate after dies are coupled to the bridge, in accordance with an embodiment.

Referring now to FIG. 4J, a cross-sectional illustration of the electronic package 400 after dies 440 are attached is shown, in accordance with an embodiment. In an embodiment, the dies 440 may include any type of die, such as those described in greater detail above. The dies 440 may include pads 441 that are coupled to pads 454 through the solder interconnects 442. The dies 440 may be electrically coupled to each other through the bridge 430. For example, the bridge 430 may include high density routing that provides electrical coupling between the two dies 440. In an embodiment, an underfill 443 may surround the solder interconnects 442.

Referring now to FIGS. 5A-6B, a series of cross-sectional illustrations depicting alternative embodiments are shown. Particularly, due to the highly coplanar nature of the top surface of the bridge and the top surface of the glass substrate, additional interconnect architectures are enabled. For example, hybrid bonding architectures or solder interconnect architectures may be used in some embodiments.

Figure 5A:
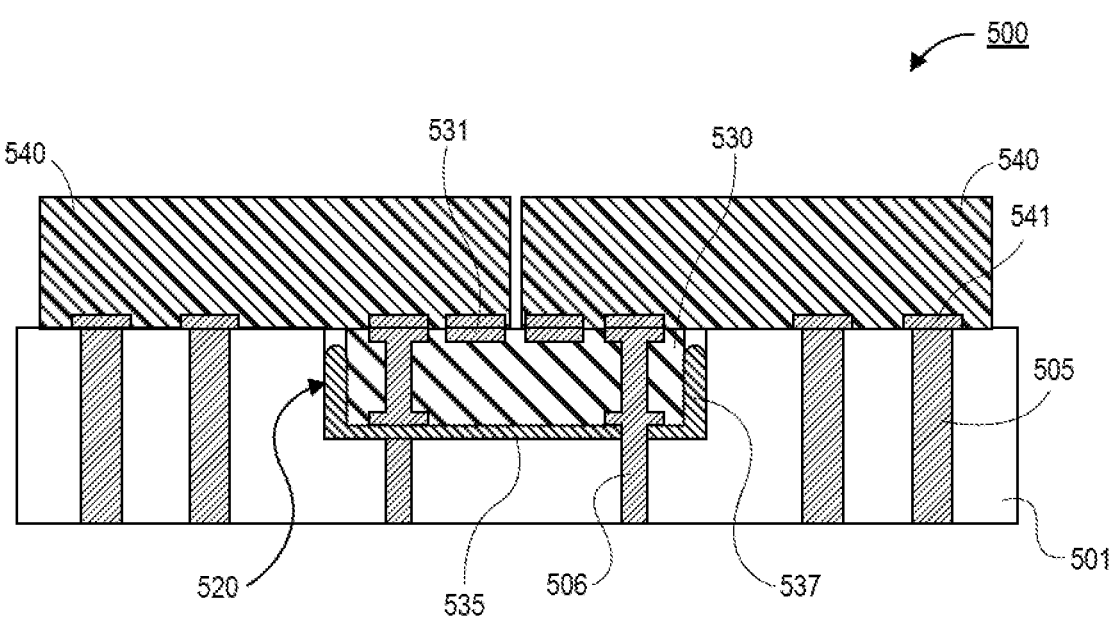
FIG. 5A is a cross-sectional illustration of a pair of dies hybrid bonded to the bridge without a cavity fill, in accordance with an embodiment.

Referring now to FIG. 5A, a cross-sectional illustration of an electronic package 500 is shown, in accordance with an embodiment. In an embodiment, the electronic package 500 may include a glass substrate 501. A cavity 520 may be formed in the glass substrate 501. A bridge 530 may be set in the cavity 520. In a particular embodiment, a bond film 535 may separate the bottom of the bridge 530 from a bottom surface of the cavity 520. The bond film 535 may also include portions 537 that extend up sidewalls of the bridge 530. The presence of the bond film 535 allows for the top surface of the bridge 530 to be substantially coplanar with a top surface of the glass substrate 501, despite any depth non-uniformity in the cavity 520. The backside of the bridge 530 may be electrically coupled to vias 506 that are below the cavity 520. In an embodiment, vias 505 may pass through the glass substrate 501 adjacent to the cavity 520.

In an embodiment, dies 540 may be coupled to the bridge 530 and the glass substrate 501. For example, pads 541 of the dies 540 may be directly coupled to the top pads 531 of the bridge 530 and the vias 505. In a particular embodiment, the bonding may be referred to as hybrid bonding. For example, bonding occurs between the pads 541 and 531 and between the surface of the dies 540 and the surface of the bridge 530 and/or the surface of the glass substrate 501.

Figure 5B:
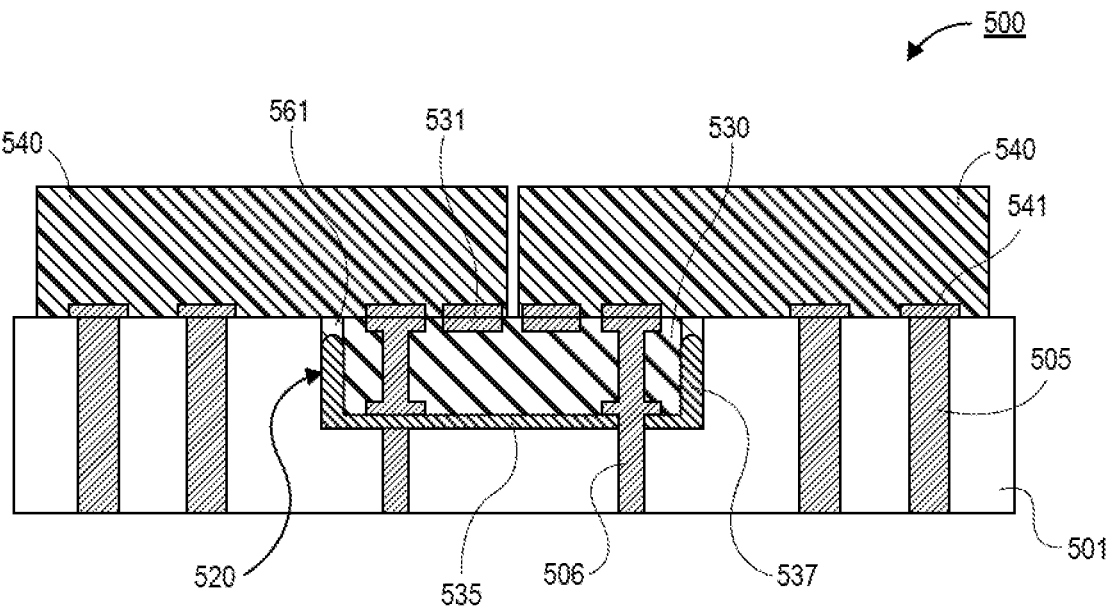
FIG. 5B is a cross-sectional illustration of a pair of dies hybrid bonded to the bridge with a cavity fill, in accordance with an embodiment.

In the illustrated embodiment, the cavity 520 may not be fully filled. That is, the bridge 530 and the bond film 535 (and vertical portions 537) may not completely fill the volume of the cavity 520. In some embodiments, as shown in FIG. 5A, the remaining portions of the cavity 520 remain unfilled. That is, an air gap may be maintained in the cavity 520. However, in other embodiments, the cavity 520 may be fully filled. For example, FIG. 5B is a cross-sectional illustration of an electronic package 500 with a cavity that is fully filled. As shown, filler 561 fills the remaining portions of the cavity 520.

Figure 6A:
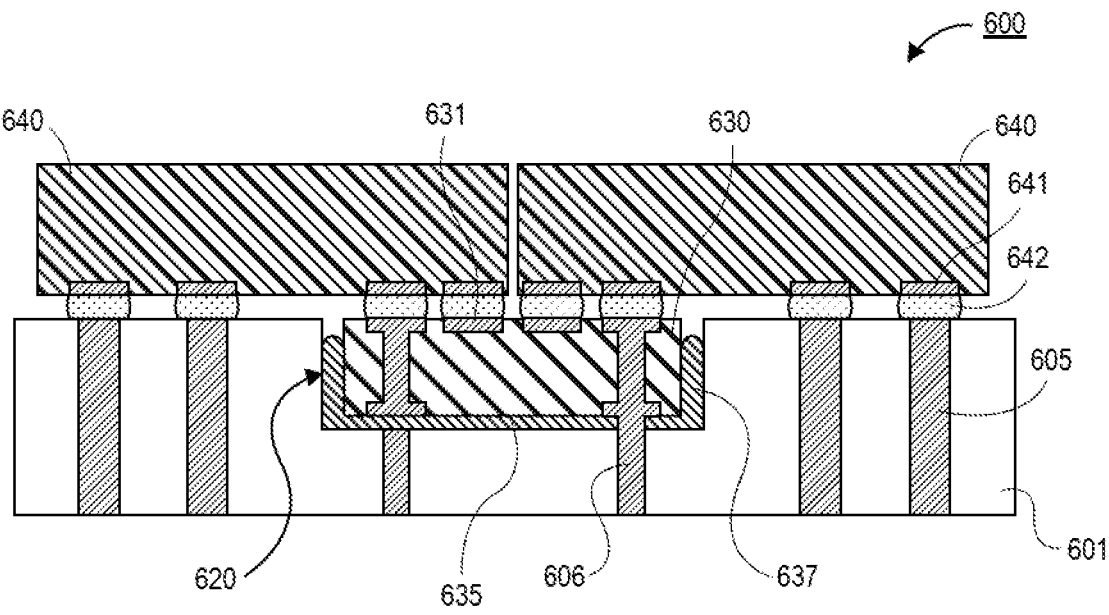
FIG. 6A is a cross-sectional illustration of a pair of dies coupled to the bridge through solder interconnects without a cavity fill, in accordance with an embodiment.

Referring now to FIG. 6A a cross-sectional illustration of an electronic package 600 is shown, in accordance with an embodiment. In an embodiment, the electronic package 600 may include a glass substrate 601. A cavity 620 may be formed in the glass substrate 601. A bridge 630 may be set in the cavity 620. In a particular embodiment, a bond film 635 may separate the bottom of the bridge 630 from a bottom surface of the cavity 620. The bond film 635 may also include portions 637 that extend up sidewalls of the bridge 630. The presence of the bond film 635 allows for the top surface of the bridge 630 to be substantially coplanar with a top surface of the glass substrate 601, despite any depth non-uniformity in the cavity 620. The backside of the bridge 630 may be electrically coupled to vias 606 that are below the cavity 620. In an embodiment, vias 605 may pass through the glass substrate 601 adjacent to the cavity 620.

In an embodiment, dies 640 may be coupled to the bridge 630 and the glass substrate 601. For example, pads 641 of the dies 640 may be coupled to the top pads 631 of the bridge 630 and the vias 605 by interconnects 642. In a particular embodiment, the interconnects 642 may be solder interconnects or the like. In the illustrated embodiment, there is no underfill around the interconnects 642. Though, it is to be appreciated that underfill may surround the interconnects 642 in some embodiments.

Figure 6B:
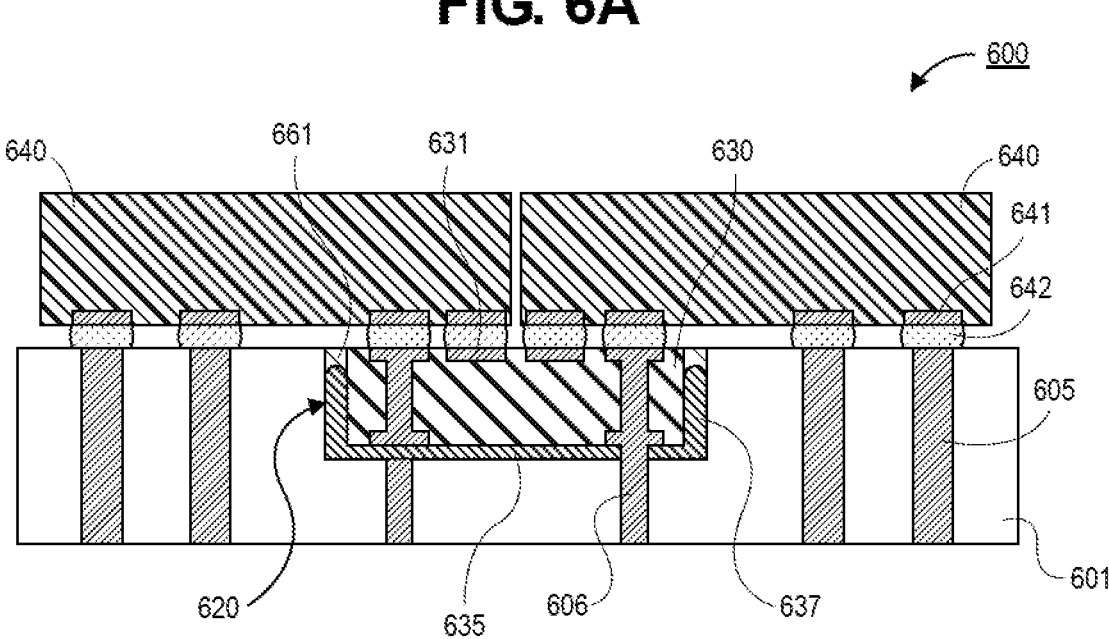
FIG. 6B is a cross-sectional illustration of a pair of dies coupled to the bridge through solder interconnects with a cavity fill, in accordance with an embodiment.

In the illustrated embodiment, the cavity 620 may not be fully filled. That is, the bridge 630 and the bond film 635 (and vertical portions 637) may not completely fill the volume of the cavity 620. In some embodiments, as shown in FIG. 6A, the remaining portions of the cavity 620 remain unfilled. That is, an air gap may be maintained in the cavity 620. However, in other embodiments, the cavity 620 may be fully filled. For example, FIG. 6B is a cross-sectional illustration of an electronic package 600 with a cavity that is fully filled. As shown, filler 661 fills the remaining portions of the cavity 620.

Figure 7:
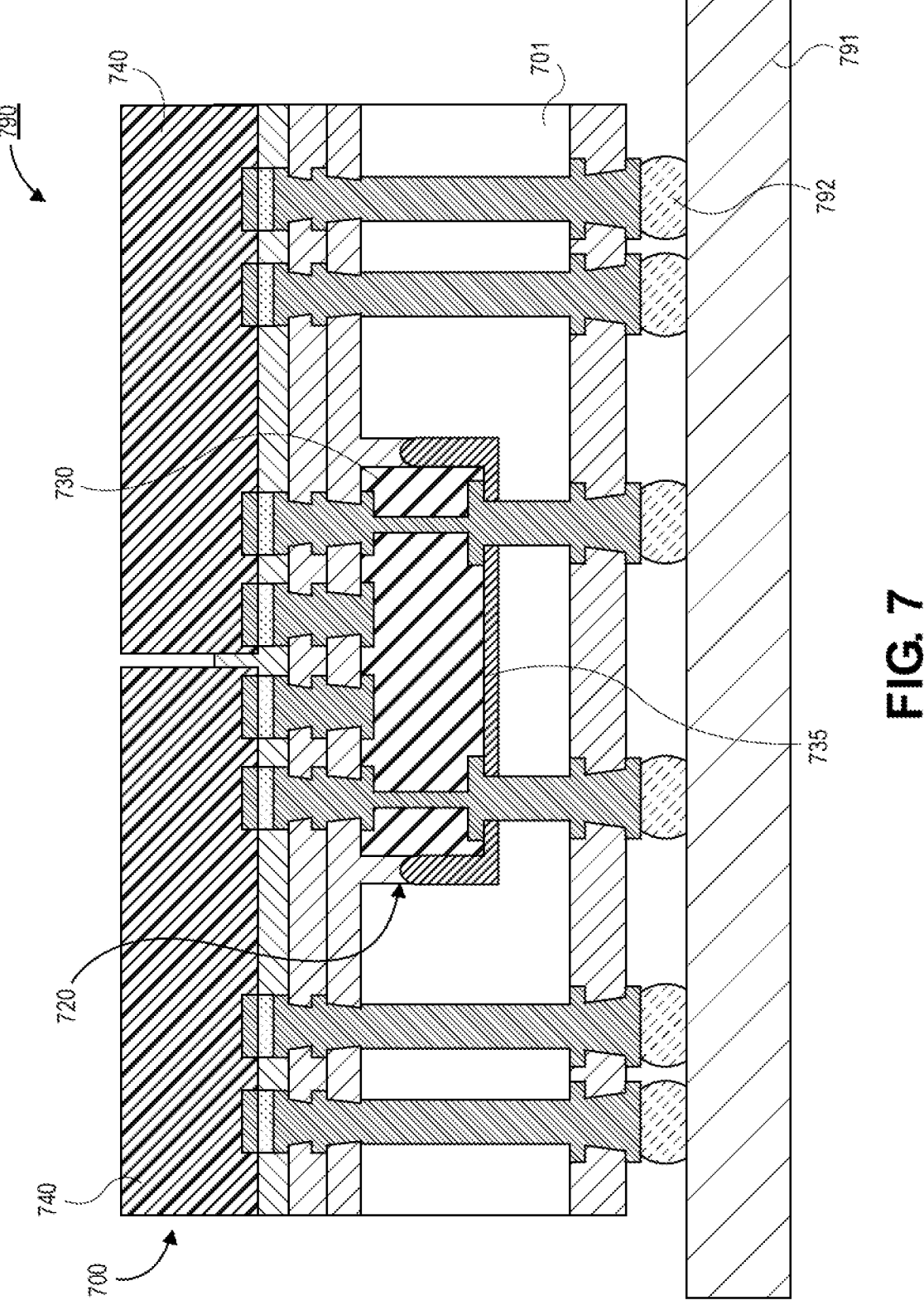
FIG. 7 is a cross-sectional illustration of an electronic system with a bridge embedded in a glass substrate, in accordance with an embodiment.

Referring now to FIG. 7, a cross-sectional illustration of an electronic system 790 is shown, in accordance with an embodiment. In an embodiment, the electronic system 790 may include a board 791, such as a printed circuit board (PCB). The board 790 may be coupled to an electronic package 700 by interconnects 792, such as solder balls or the like. In an embodiment, an organic package substrate or the like (not shown) may be provided between the electronic package 700 and the board 791. In an embodiment, the electronic package 700 may comprise a glass substrate 701 with a cavity 720. A bridge 730 may be inserted into the cavity 720. A top surface of the bridge 730 may be substantially coplanar with a top surface of the glass substrate 701 due to the presence of a bond film 735. In an embodiment, a pair of dies 740 may be electrically coupled to each other through the bridge 730.

In the illustrated embodiment, the electronic package 700 is substantially similar to the electronic package 300 described in greater detail above. However, it is to be appreciated that any electronic package architecture disclosed herein may be integrated in an electronic system 790.

Figure 8:
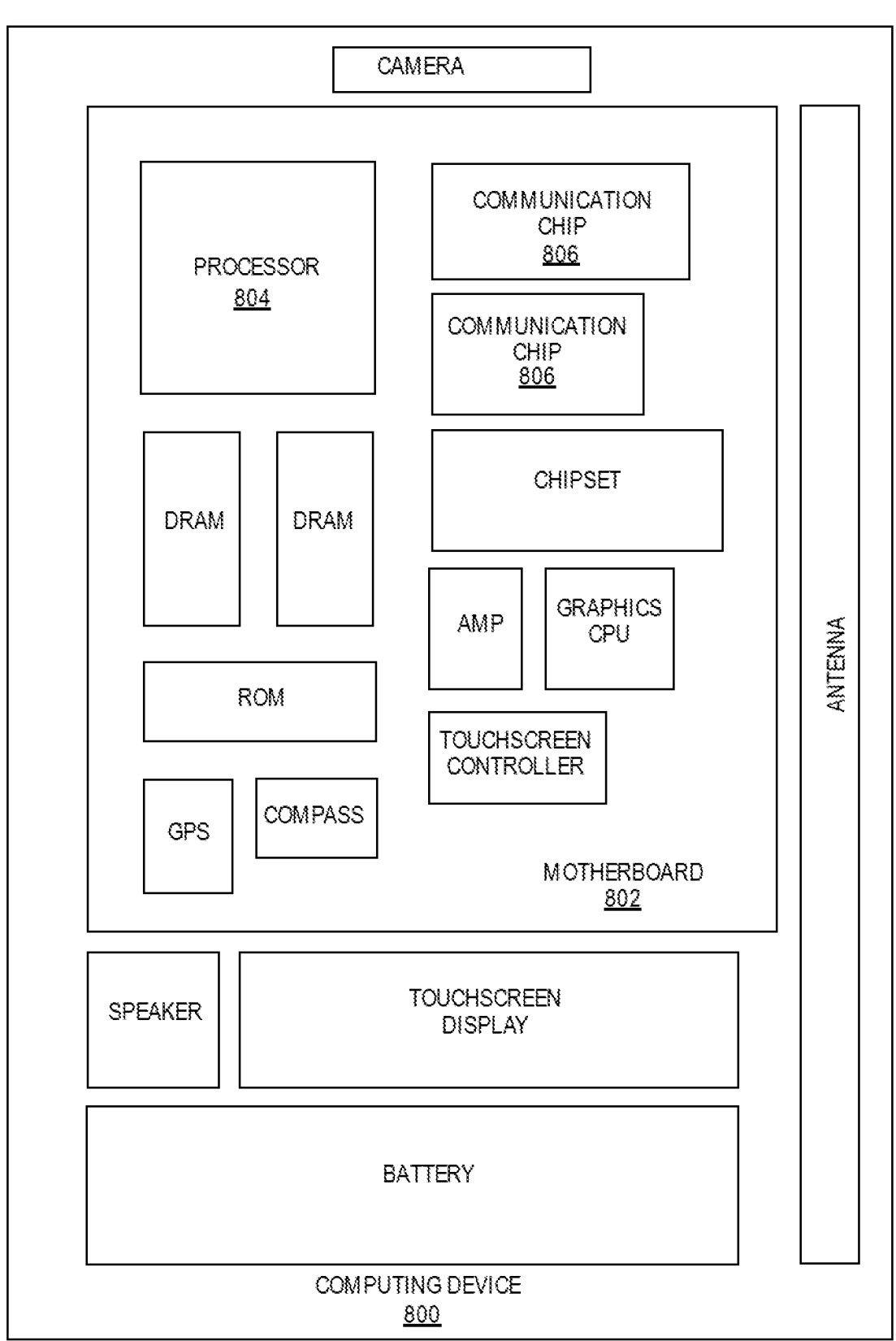
FIG. 8 is a schematic of a computing device built in accordance with an embodiment.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor may be part of an electronic package that includes a cavity in a glass substrate with a bridge in the cavity that is surrounded by a bond film, in accordance with embodiments described herein. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip may be part of an electronic package that includes a cavity in a glass substrate with a bridge in the cavity that is surrounded by a bond film, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a first substrate with a cavity, wherein the first substrate comprises glass; a second substrate in the cavity; and a bond film that covers a bottom of the second substrate and extends up sidewalls of the second substrate.

Example 2: the electronic package of Example 1, wherein a top surface of the second substrate is substantially coplanar with a top surface of the first substrate.

Example 3: the electronic package of Example 1 or Example 2, wherein a bottom surface of the cavity is not parallel to a top surface of the first substrate.

Example 4: the electronic package of Example 3, wherein a bottom surface of the second substrate is parallel to the top surface of the first substrate.

Example 5: the electronic package of Examples 1-4, wherein through substrate vias are provided through the second substrate.

Example 6: the electronic package of Example 5, wherein vias through the first substrate below the cavity are electrically coupled to the through substrate vias.

Example 7: the electronic package of Examples 1-6, further comprising: a first die electrically coupled to the second substrate; and a second die electrically coupled to the second substrate, wherein the second substrate is an electrical bridge between the first die and the second die.

Example 8: the electronic package of Example 7, wherein the first die and the second die are coupled to the second substrate through a redistribution layer.

Example 9: the electronic package of Example 7, wherein the first die and the second die are coupled to the second substrate through hybrid bonding or solder bonding.

Example 10: the electronic package of Examples 1-9, wherein a fill layer fills a remainder of the cavity not occupied by the second substrate and the bond film.

Example 11: the electronic package of Examples 1-10, wherein the bond film comprises one or more of a low filler buildup film, a liquid buildup film, and a PDMS material.

Example 12: the electronic package of Examples 1-10, wherein the bond film comprises a solder, wherein the solder is a high melting point solder or alloy.

Example 13: the electronic package of Examples 1-12, wherein the bond film extends up the sidewalls of the second substrate a distance up to approximately 100 μm.

Example 14: an electronic package, comprising: a substrate, wherein the substrate comprises glass; a cavity in the substrate, wherein the cavity has a depth variation that is up to plus or minus ten percent of an average depth of the cavity; a bridge in the cavity; and a bond film between the bridge and a bottom of the cavity, wherein the bond film conforms to the bridge to enable a top surface of the bridge to be substantially coplanar with a top surface of the substrate.

Example 15: the electronic package of Example 14, wherein the bond film extends up sidewalls of the bridge so that bond film is between sidewalls of the bridge and sidewalls of the cavity.

Example 16: the electronic package of Example 15, wherein the bond film extends up sidewalls of the bridge a distance between approximately 10% and approximately 90% of a depth of the cavity.

Example 17: the electronic package of Examples 14-16, wherein the bridge comprises through substrate vias.

Example 18: the electronic package of Example 17, wherein the through substrate vias are electrically coupled to vias through the substrate, wherein the vias through the substrate are below the cavity.

Example 19: the electronic package of Examples 14-18, wherein the bottom of the cavity is sloped.

Example 20: the electronic package of Examples 14-19, further comprising: a first die coupled to the bridge; and a second die coupled to the bridge, wherein the bridge electrically couples the first die to the second die.

Example 21: the electronic package of Example 20, wherein the first die and the second die are hybrid bonded to the bridge.

Example 22: the electronic package of Example 20, wherein the first die and the second die are coupled to the bridge by solder.

Example 23: the electronic package of Examples 14-22, wherein a remainder of the cavity not occupied by the bridge and the bond film is filled with a filler material.

Example 24: an electronic system, comprising: a board; a package substrate coupled to the board, wherein the package substrate comprises glass; a cavity in the package substrate; a bridge in the cavity, wherein a bond film in the cavity conforms to a bottom surface and sidewall surfaces of the bridge; and a first die and a second die electrically coupled together by the bridge.

Example 25: the electronic system of Example 24, wherein a bottom of the cavity is non-parallel to a top surface of the package substrate.

What is claimed is:

1. An electronic package, comprising:
a first substrate with a cavity, wherein the first substrate comprises glass, and wherein a bottom surface of the cavity is not parallel to a top surface of the first substrate;
a second substrate in the cavity; and
a bond film that covers a bottom of the second substrate.

2. The electronic package of claim 1, wherein a top surface of the second substrate is substantially coplanar with a top surface of the first substrate.

3. The electronic package of claim 1, wherein the bond film has a variable thickness along the bottom surface of the cavity.

4. The electronic package of claim 1, wherein a bottom surface of the second substrate is parallel to the top surface of the first substrate.

5. The electronic package of claim 1, wherein through substrate vias are provided through the second substrate.

6. The electronic package of claim 5, wherein vias through the first substrate below the cavity are electrically coupled to the through substrate vias.

7. The electronic package of claim 1, further comprising:
a first die electrically coupled to the second substrate; and
a second die electrically coupled to the second substrate, wherein the second substrate is an electrical bridge between the first die and the second die.

8. The electronic package of claim 7, wherein the first die and the second die are coupled to the second substrate through a redistribution layer.

9. The electronic package of claim 7, wherein the first die and the second die are coupled to the second substrate through hybrid bonding or solder bonding.

10. The electronic package of claim 1, wherein a fill layer fills a remainder of the cavity not occupied by the second substrate and the bond film.

11. The electronic package of claim 1, wherein the bond film comprises one or more of a low filler buildup film, a liquid buildup film, and a PDMS material.

12. The electronic package of claim 1, wherein the bond film comprises a solder, wherein the solder is a high melting point solder or alloy.

13. The electronic package of claim 1, wherein the bond film extends up the sidewalls of the second substrate a distance up to approximately 100 μm.

14. An electronic package, comprising:
a substrate, wherein the substrate comprises glass;
a cavity in the substrate, wherein the bottom of the cavity is sloped;
a bridge in the cavity; and a bond film between the bridge and a bottom of the cavity, wherein the bond film conforms to the bridge to enable a top surface of the bridge to be substantially coplanar with a top surface of the substrate.

15. The electronic package of claim 14, wherein the bond film extends up sidewalls of the bridge so that bond film is between sidewalls of the bridge and sidewalls of the cavity.

16. The electronic package of claim 15, wherein the bond film extends up sidewalls of the bridge a distance between approximately 10% and approximately 90% of a depth of the cavity.

17. The electronic package of claim 14, wherein the bridge comprises through substrate vias.

18. The electronic package of claim 17, wherein the through substrate vias are electrically coupled to vias through the substrate, wherein the vias through the substrate are below the cavity.

19. The electronic package of claim 14, wherein the bond film has a variable thickness along the bottom of the cavity.

20. The electronic package of claim 14, further comprising:

a first die coupled to the bridge; and a second die coupled to the bridge, wherein the bridge electrically couples the first die to the second die.

21. The electronic package of claim 20, wherein the first die and the second die are hybrid bonded to the bridge.

22. The electronic package of claim 20, wherein the first die and the second die are coupled to the bridge by solder.

23. The electronic package of claim 14, wherein a remainder of the cavity not occupied by the bridge and the bond film is filled with a filler material.

24. An electronic system, comprising:

a board;

a package substrate coupled to the board, wherein the package substrate comprises glass;

a cavity in the package substrate, wherein a bottom of the cavity is non-parallel to a top surface of the package substrate;

a bridge in the cavity, wherein a bond film in the cavity conforms to a bottom surface and sidewall surfaces of the bridge; and a first die and a second die electrically coupled together by the bridge.

25. The electronic system of claim 24, wherein the bond film has a variable thickness along the bottom of the cavity.

26. An electronic package, comprising:

a first substrate with a cavity, wherein the first substrate comprises glass;

a second substrate in the cavity; and a bond film that covers a bottom of the second substrate and extends up sidewalls of the second substrate, wherein a fill layer fills a remainder of the cavity not occupied by the second substrate and the bond film.

27. An electronic package, comprising:

a first substrate with a cavity, wherein the first substrate comprises glass;

a second substrate in the cavity; and a bond film that covers a bottom of the second substrate and extends up sidewalls of the second substrate, wherein the bond film comprises a solder, wherein the solder is a high melting point solder or alloy.

\* \* \* \* \*